United States Patent [19]

Hayakawa et al.

[11] Patent Number: 5,619,457
[45] Date of Patent: Apr. 8, 1997

[54] DYNAMIC SEMICONDUCTOR MEMORY DEVICE THAT CAN CONTROL THROUGH CURRENT OF INPUT BUFFER CIRCUIT FOR EXTERNAL INPUT/OUTPUT CONTROL SIGNAL

[75] Inventors: Goro Hayakawa; Yasuhiko Tsukikawa, both of Hyogo, Japan

[73] Assignee: Mitsubishi Denki Kabushiki Kaisha, Tokyo, Japan

[21] Appl. No.: 589,687

[22] Filed: Jan. 22, 1996

[30] Foreign Application Priority Data

Apr. 26, 1995 [JP] Japan ................................ 7-102473

[51] Int. Cl.⁶ ...................................................... G11C 11/34
[52] U.S. Cl. .............................. 365/189.05; 365/189.01; 365/222; 365/228; 365/233
[58] Field of Search ...................... 365/189.05, 189.01, 365/222, 228, 229, 233

Primary Examiner—David C. Nelms
Assistant Examiner—F. Niranjan
Attorney, Agent, or Firm—Lowe, Price, LeBlanc & Becker

[57] ABSTRACT

A first logic gate circuit receives an internal row strobe signal, an internal column strobe signal and a self refresh mode for providing an operation state detection signal. The operation state detection signal attains an H level when in a stand-by state and a self refresh state. A second CMOS logic gate circuit is closed when the operation state detection signal attains an H level. Therefore, an external input/output control signal is not transmitted to the internal circuit, and a through current does not flow in the CMOS logic gate independent of the level of the external input/output control signal.

5 Claims, 6 Drawing Sheets

FIG.4
| | ZRASF | ZCASF | ZBBU | S | EXT ZWE (EXT ZOE) | WEF (OEF) |
|---|---|---|---|---|---|---|
| STANDBY STATE | H | H | H | H | H | L |
| | | | | | L | L |
| SELF REFRESH STATE | L | L | L | H | H | L |
| | | | | | L | L |
| READ/WRITE STATE | L | L | H | L | H | L |
| | | | | | L | H |
| | H | L | H | L | H | L |
| | | | | | L | H |
FIG.5
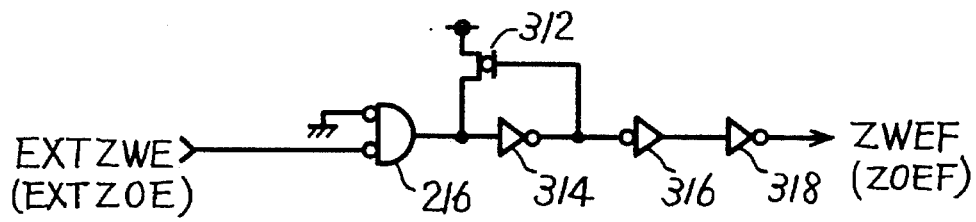
FIG.6
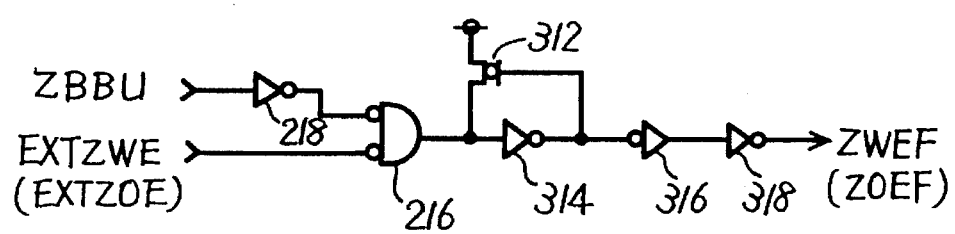

DYNAMIC SEMICONDUCTOR MEMORY DEVICE THAT CAN CONTROL THROUGH CURRENT OF INPUT BUFFER CIRCUIT FOR EXTERNAL INPUT/OUTPUT CONTROL SIGNAL

BACKGROUND OF THE INVENTION

1. Field of the Invention

The present invention relates to semiconductor memory devices having the data input/output operation controlled by an input/output control signal applied via a buffer circuit. More particularly, the present invention relates to a dynamic semiconductor memory device including an CMOS buffer circuit receiving an input/output control signal for rewriting stored information according to a refresh operation.

2. Description of the Background Art

In recent years, increase in speed and reduction in consumption power are important factors in semiconductor memory devices, particularly in an DRAM (Dynamic Random Access Memory). Reduction in the standby current when operated by the power of a battery is particularly regarded as an important factor.

In an DRAM, a standby current refers to the consumed current when power supply potentials $V_{cc}$ and $V_{ss}$ are applied to drive a row strobe signal (/RAS signal) and a column strobe signal (/CAS signal) which are control signals to an H level (logical high). According to the product standards, the level of input pins other than those of signals /RAS and /CAS are arbitrary.

Data input/output between an DRAM and the outside world is controlled by a write enable signal (/WE signal) which is an external control signal for a writing operation and an output enable signal (/OE signal) which is an external control signal for a readout operation. These external input/output signals are transmitted to an DRAM internal circuit via an input buffer circuit of an CMOS circuit.

Since the level of the input pins of these external input/output control signals are arbitrary in the above mentioned stand-by state, a through current will flow to the CMOS circuit to increase power consumption if the potential level of these pins attains an intermediate level of an H level and an L level (logical low) of the CMOS circuit.

The above problem will be described in more detail hereinafter.

FIG. 5 shows a first conventional implement of a first stage input buffer of signal /WE or a signal /OE. In the following description of the operation of the buffer circuit, an external write enable signal and an external output enable signal are represented as EXTZWE and EXTZOE, respectively, and an internal write enable signal and an internal output enable signal are represented as ZWEF and ZOEF, respectively, to distinguish an external input/output control signal from an internal input/output control signal passed through an input buffer circuit.

Signal EXTZWE is applied to the other input terminal of an NOR circuit 216 having one input terminal fixed to an L level. Therefore, the output signal of NOR circuit 216 is an inverted version of signal EXTZWE. This output signal is applied to a half latch circuit formed of a P channel MOS transistor 312 and an inverter 314 to have its value maintained. The output of this latch circuit is applied to a drive circuit formed of inverters 316 and 318 to be output as signal ZWEF.

External input/output control signal EXTZOE is transmitted in a manner identical to the above.

FIG. 11 shows an example of a structure of NOR circuit 216.

NOR circuit 216 includes P channel MOS transistors 220 and 222 connected in series between power supply potential $V_{cc}$ corresponding to an H level and power supply potential $V_{ss}$ corresponding to an L level, and N channel MOS transistors 226 and 224 connected in parallel to P channel MOS transistors 220 and 222.

In the first conventional implement of FIG. 5, signal S which is one input signal of NOR circuit 216 is fixed to the L level. Therefore, P channel MOS transistor 220 is always conductive. When signal EXTZWE attains an intermediate potential level, a through current will flow via P channel MOS transistors 220 and 222 and N channel MOS transistor 224.

FIG. 6 shows a second implement of an input buffer circuit of signal /WE or /OE directed to prevent generation of the above-described through current during a self refresh operation.

A memory cell of an DRAM generally has a structure of storing information by means of charge in a capacitor.

Therefore, charge stored in the capacitor due to a writing operation of data is gradually drawn out by various leakage such as a subthreshold current of an access transistor. It is therefore necessary to carry out a refresh operation of reading out and then rewriting the data again before the stored information is completely lost.

A refresh operation interrupting a random access operation of reading/writing and a refresh operation carried out only for maintaining the stored information in the chip such as during a battery backup term are known. A CBR (/CAS before/RAS) refresh operation, for example, is typical of the former. Also, a self refresh operation is typical of the latter.

It is possible to suppress generation of a through current in an input buffer circuit during a self refresh period by inactivating the above-described external input/output control signal input buffer circuit only during this self refresh period by a signal having its level changed.

In the second implement shown in FIG. 6, signal ZBBU is employed as the signal whose level is altered only during the self-refresh time period.

An operation of a DRAM circuit controlled by signal ZBBU will be described hereinafter.

In general, a partial activation operation is employed in a DRAM for the purpose of reducing consumption power. The number of partitioned blocks are apt to be increased together with increase of the storage capacity. However, advance in the partitioned operation will result in a greater number of refresh cycles (the number of refresh operations required to refresh all the memory cells on the chip).

Increase in the memory capacity has resulted in a lower absolute value of the capacitance of the memory cell capacitor. Leakage current of a capacitor in a memory cell is increased due to various elements such as a thinner dielectric film of a capacitor, degradation of the subthreshold characteristics of an access transistor, and closer distance between each memory cell. The tendency of degradation in refresh characteristics of a memory (implies the duration of time where data can be maintained in a memory cell without a refresh operation) is noticeable.

It is therefore desirable to minimize the number of refresh cycles. For the purpose of reducing the operating current during a self refresh operation and reducing the number of refresh cycles, an approach of operating more blocks during a self refresh operation than in a normal operation is taken.

FIG. 7 shows a structure of an DRAM divided into 8 blocks. Signal ZBBU is a self refresh mode signal and attains an L level during a self refresh operation. In a normal operation mode, signal ZBBU attains an H level whereby only one of the eight blocks selected by the block addresses $Z_0$–$Z_2$ is selected by an appropriate one block address.

In a self refresh operation, signal ZBBU attains an L level, whereby two blocks out of the eight blocks are operated. When $(Z_2, Z_1, Z_0)=(0, 0, 0)$ for example, the outputs of OR circuits 508 and 528 attain an H level regardless of the value $Z_2$ if signal ZBBU=L. Therefore, blocks (0, 0, 0) and (1, 0, 0) are selected at the same time.

Signal ZBBU is not limited to the above-described signal, and an operation similar to that described in the following can be implemented as long as the level is altered only during a self refresh period.

According to the second conventional implement shown in FIG. 6, a structure of applying an inverted version of signal ZBBU by inverter 218 to one input terminal of NOR circuit 216 allows NOR circuit 216 to be constantly closed regardless of the level signal EXTZWE.

More specifically, since P channel MOS transistor 220 in FIG. 11 is closed during a self refresh period, no through current flows through NOR circuit 216 even if signal EXTZWE attains an intermediate level.

However, a conventional input buffer circuit of the above-described structure receiving an input/output control signal has a problem that there is a possibility of generation of a through current therein when the DRAM attains a stand-by state, i.e. when signals /RAS and /CAS both attain an H level and the level of other input pins is arbitrary.

SUMMARY OF THE INVENTION

In view of the foregoing, an object of the present invention is to provide an input/output control signal input buffer circuit that has generation of a through current suppressed even in a stand-by state, i.e. with no increase in consumption power.

Another object of the present invention is to provide an external input/output signal input buffer circuit in which an internal input/output control signal is not affected by a change in an external input/output control signal.

According to an aspect of the present invention, a dynamic semiconductor memory device that can set three operation modes of a stand-by state, a self refresh state, and a read/write operation state includes a timing signal generation circuit, a control signal input buffer circuit, and a data input/output buffer circuit. The timing signal generation circuit responds to an external signal to provide an internal signal specifying one of the three operation modes. The control signal input buffer circuit receives an internal signal and an external input/output control signal for providing an internal input/output control signal. The control signal input buffer circuit includes a first CMOS logic gate circuit receiving an external input/output control signal for providing a corresponding internal input/output control signal when in a read/write operation state, and attaining a closed state when in the stand-by state and the self refresh state. The data input/output buffer circuit responds to an internal input/output control signal for receiving/transmitting data with the outside world.

According to another aspect of the present invention, a dynamic semiconductor memory device that allows specification of three operation modes of a stand-by state, a self refresh state, and a read/write operation state by a combination of signal levels of a first external signal and a second external signal, includes a timing signal generation circuit, a control signal input buffer circuit, and a data input/output buffer circuit.

The timing signal generation circuit responds to the first and second external signals to provide corresponding first and second internal signals and a self refresh mode signal. The control signal input buffer circuit receives the first internal signal, the second internal signal, the self refresh mode signal, and the external input/output control signal to provide an internal input/output control signal. The control signal input buffer circuit includes a first logic gate circuit receiving the first internal signal, the second internal signal, and the self refresh mode signal to provide an operation state detection signal, and a second CMOS logic gate circuit controlled by an operation state detection signal and receiving the external input/output control signal for providing a corresponding internal input/output control signal when in the read/write operation state, and attaining a closed state when in the stand-by state and the self refresh state. The data input/output buffer circuit responds to an internal input/output control signal to carry out data input/output with the outside world.

A main advantage of the present invention is that the second CMOS logic gate circuit directly receiving an external input/output control signal in the control signal input buffer circuit attains a closed state when in the stand-by state and the self refresh state, so that a through current is not generated in these states. Therefore, increase in power consumption in a dynamic semiconductor memory device can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a signal level relationship diagram showing an operation of an external input/output control signal input buffer circuit according to the present invention.

FIG. 5 is a circuit diagram showing a first conventional implement of an input/output control signal input buffer circuit.

FIG. 6 is a circuit diagram showing a second conventional implement of an input/output control signal input buffer circuit.

DESCRIPTION OF THE PREFERRED EMBODIMENTS

Figure 3:
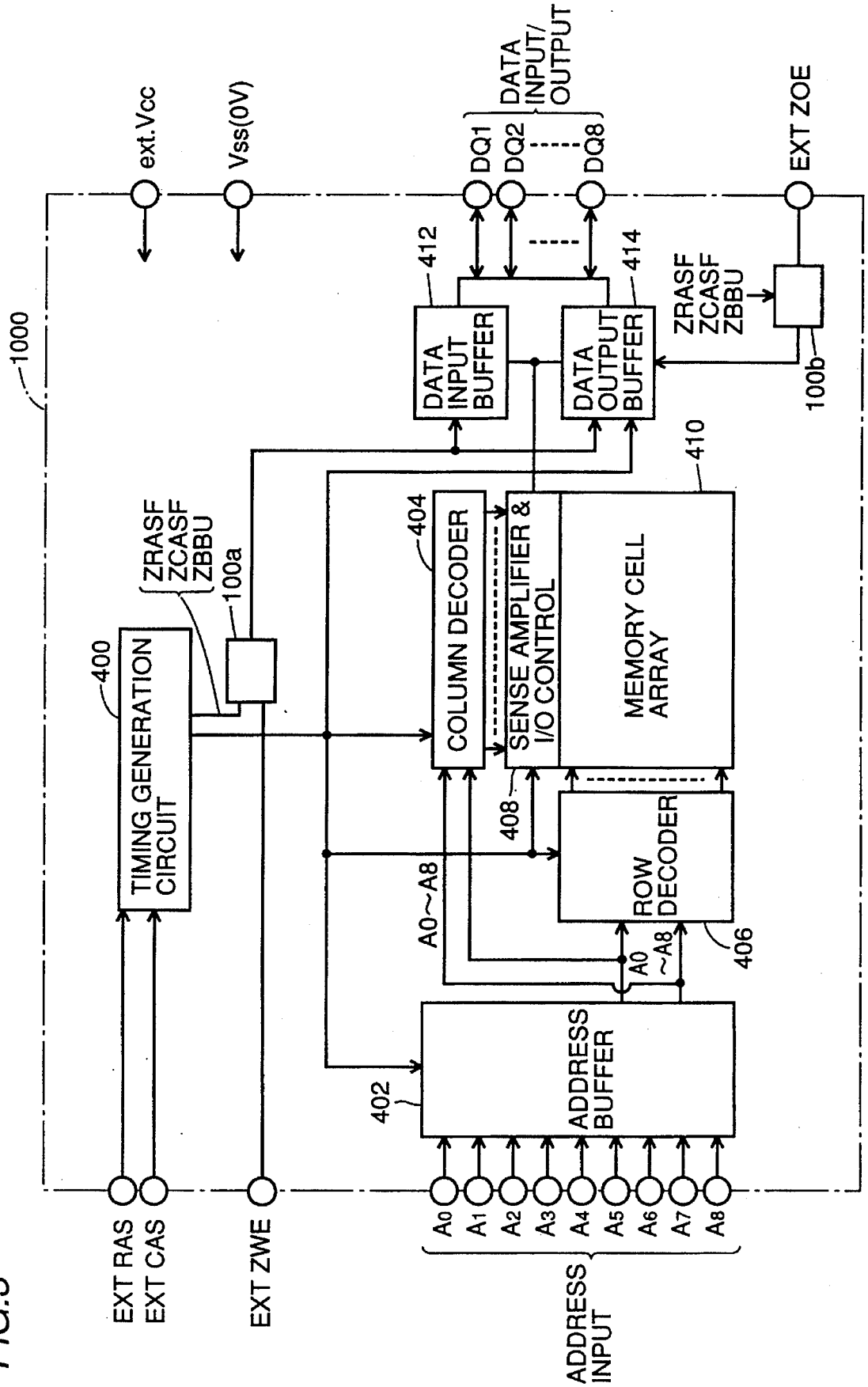
FIG. 3 is a schematic block diagram showing a structure of a dynamic semiconductor memory device according to the present invention.
Figure 7:
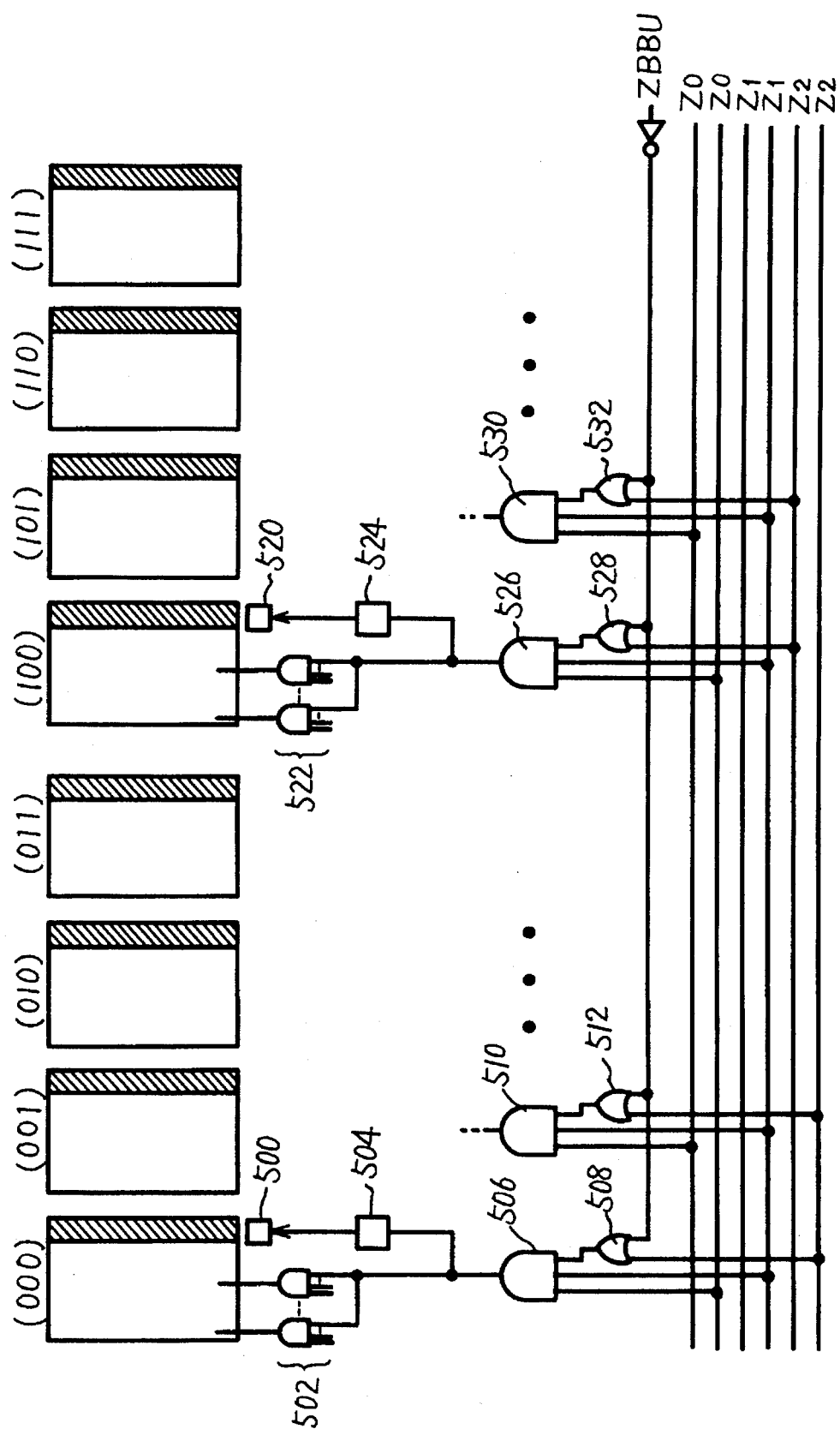
FIG. 7 is a schematic block diagram showing a structure of a dynamic semiconductor memory device divided into blocks.

FIG. 3 is a schematic block diagram showing a structure of a dynamic semiconductor memory device including an input/output control signal input buffer circuit according to the present invention.

In FIG. 3, an address buffer 402 selectively supplies externally applied address signals A0–A8 to a row decoder 406 and a column decoder 404. Row decoder 406 responds to a row address signal supplied from address buffer 402 to select and drive one of a plurality of word lines WL. Column decoder 404 responds to a column address signal applied from address buffer 402 to select one of a plurality of bit line pairs.

A sense amplifier 408 amplifies potential difference between a corresponding bit line pair. The amplified signal corresponding to the bit line pair selected by column decoder 404 is supplied to output buffer 414. Output buffer 414 amplifies the supplied potential to provide output data DQ1–DQ8 to the outside world. Data input buffer 412 amplifies externally applied input data DQ1–DQ8. This amplified signal is supplied to the bit line pair selected by column decoder 404.

Figure 8:
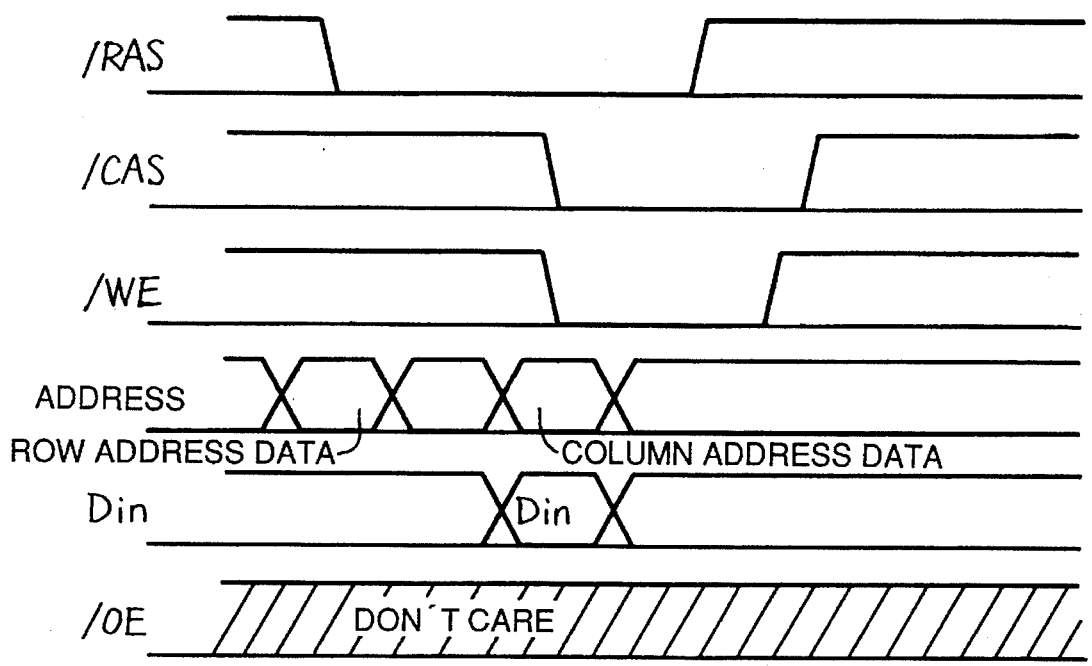
FIG. 8 is a timing chart of a writing operation of a dynamic semiconductor memory device.

A writing operation of a conventional dynamic semiconductor memory device shown in the schematic block diagram of FIG. 3 will be described according to the timing chart of FIG. 8 of an external signal. A row address signal is entered into address buffer 402 when signal /RAS is pulled down to be applied to row decoder 406. Then, a column address signal is entered to address buffer 402 when signal /CAS is pulled down. The column address signal is applied to column decoder 404. In this case, at the fall of signal /CAS, a column address is entered into buffer 404 and Din (input data) is entered into data input buffer 412. The data from data input buffer 412 is written into a bit line selected by the column address. This writing operation is activated when signals /CAS and /WE both attain an L level.

More specifically, data entry is effected in response to signal /WE, i.e. external input control signal EXTWE applied to data input/output buffer 412 via an input/output control signal input buffer circuit 100a.

Here, external input/output control signal input buffer circuit 100a is controlled by an internal row strobe signal (ZRASF signal), an internal column strobe signal (ZCASF signal) and a self refresh mode signal (ZBBU signal) which are generated by timing generation circuit 400 in response to signals /RAS and /CAS, i.e. external row and column strobe signals. In a writing operation, input/output control signal input buffer circuit 100a provides an internal input/output control signal ZWEF according to signal EXTZWE.

Figure 9:
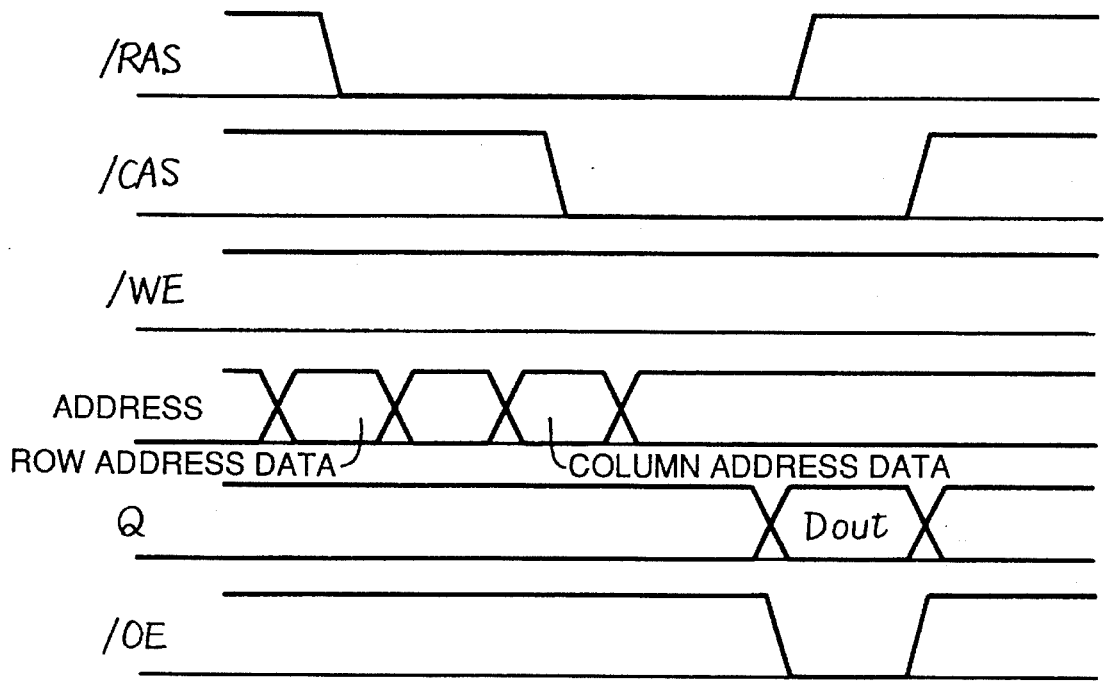
FIG. 9 is a timing chart of a reading operation of a dynamic semiconductor memory device.

A reading operation will be described hereinafter with reference to FIGS. 3 and 9.

The operation of a row address and a column address entered into address buffer 402 is similar to that of the writing operation. When a column address signal is entered in column decoder 404, the following series of readout operations are carried out when signal /WE attains an H level. More specifically, stored data located at a specified row and column is amplified to be transferred to data output buffer 414. In response to output enable signal (/OE signal), i.e. external output enable signal EXTZOE, attaining an L level, an internal output control signal (ZOEF signal) is applied to data output buffer 414 via external input/output control signal input buffer circuit 100b. The data is provided to an output pin.

Here, external input/output control signal input buffer circuit 100b is controlled by signals ZRASF, ZCASF and ZBBU to provide an internal input/output control signal ZOEF according to signal EXTZOE.

Figure 10:
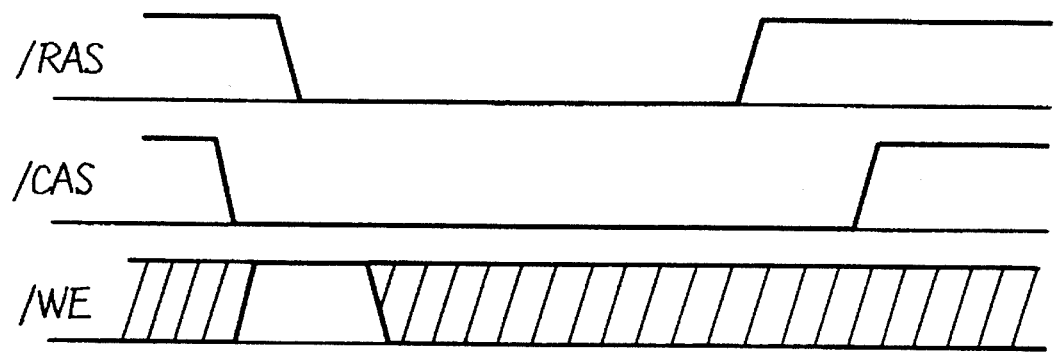
FIG. 10 is a timing chart of a self refresh mode of a dynamic semiconductor memory device.
Figure 11:
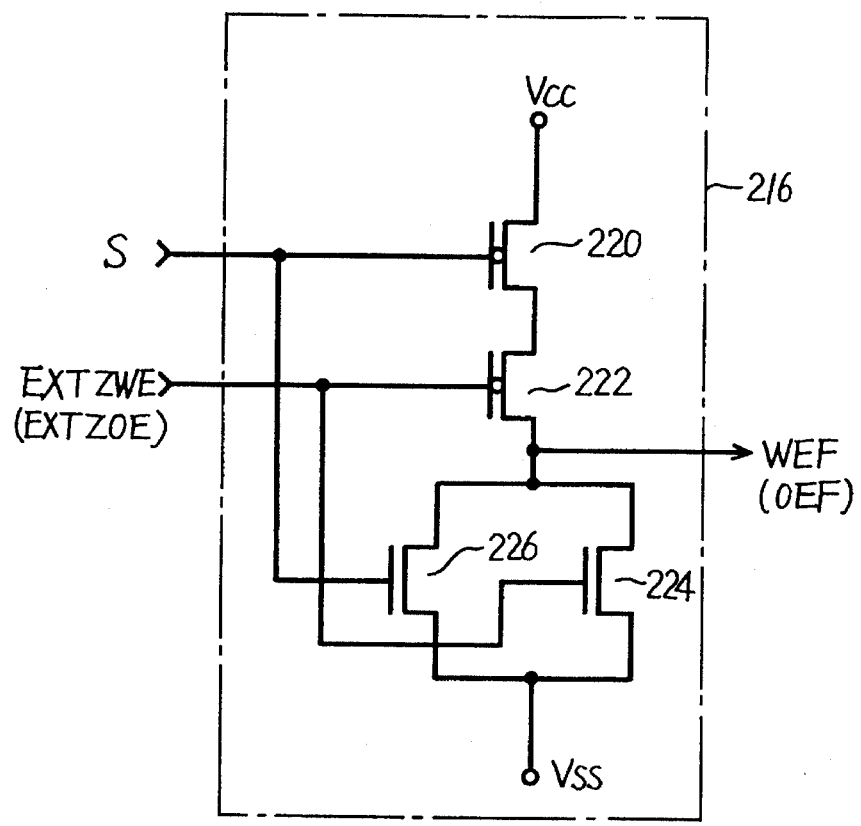
FIG. 11 is a circuit diagram showing an CMOS NOR circuit.

Referring to FIG. 10, transition of external signals in a self refresh operation will be described hereinafter.

A self refresh operation is initiated when signal /RAS is pulled down after the fall of signal /CAS, opposite to the above-described reading/writing operation, after a normal memory cycle, and detection is made that signal /WE attains an H level and that a duration of at least 100 μs of an L period of signal /RAS elapses. It is to be noted that signal /WE may take an arbitrary signal level except at the time of the fall of signal /RAS when signal /WE must attain an H level. In FIG. 10, the region where signal /WE may take an arbitrary signal level is indicated by the hatched lines.

A self refresh operation is continued as long as signals /RAS and /CAS both attain an L level.

Here, internal row strobe signal ZRAS is generated from timing generation circuit 400 periodically in alternation of an H level and an L level to control a self refresh operation.

During this self refresh operation time period, signal ZBBU attains an L level as described before.

Furthermore, signals /RAS and /CAS both attain an H level in a stand-by state. The level of remaining external signals is arbitrary.

In view of the foregoing, the following applies for the internal control signals of signals ZRASF, ZCASF and ZBBU.

There are two manners of a reading/writing operation. One case is when signals ZRAS and ZCASF both attain an L level and signal ZBBU attains an H level, and the other case is when signals ZRASF and ZCASF attain an H level and an L level, respectively, and signal ZBBU attains an H level.

In a stand-by state, signals ZRASF, ZCSF and ZBBU all attain an H level.

In a self refresh state, signals ZCASF and ZBBU attain an H level, and signal ZRASF attains an L or H level.

In view of the above-described conditions, the structure and operation of external input/output control signal input buffer 100 will be described in detail hereinafter.

Figure 1:
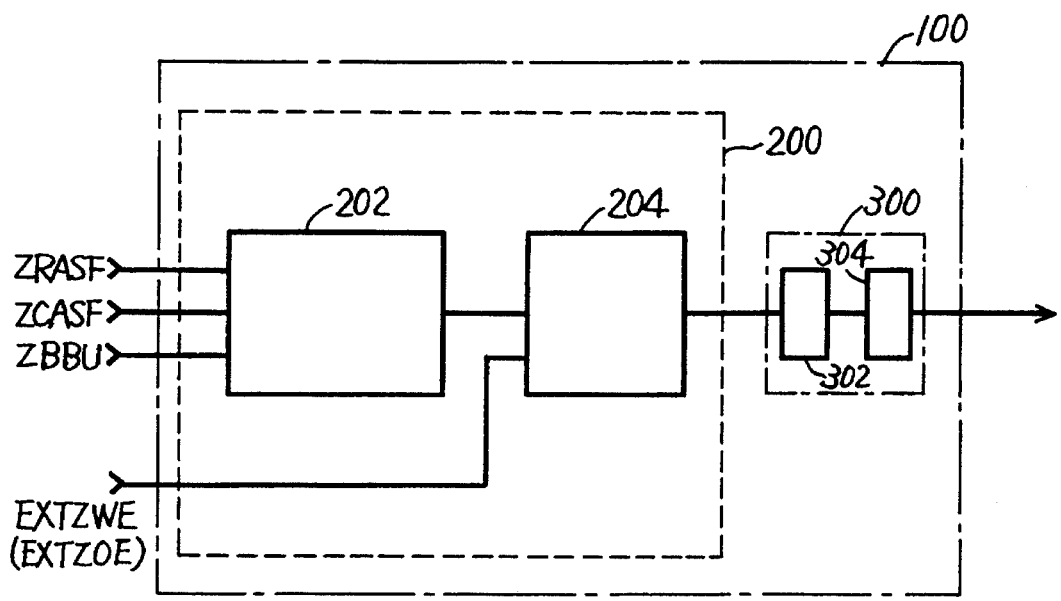
FIG. 1 is a schematic block diagram showing a structure of an external input/output control signal input buffer circuit in a dynamic semiconductor memory device according to an embodiment of the present invention.

FIG. 1 is a schematic block diagram showing a structure of external input/output control signal input buffer circuit 100 according to the present invention.

A first logic gate circuit 200 receives internal signals of ZRASF, ZCASF, and ZBBU to provide an operating state detection signal S. Operation state detection signal S attains an L level in a read/write state, and attains an H level in a stand-by or self refresh state.

A second CMOS logic gate circuit 204 receives operation state detection S and external input/output control signal EXTZWE to provide a corresponding signal WEF. A latch circuit 302 maintains the state of signal WEF. A driver circuit 304 receives an output of latch circuit 302 to provide an internal input/output control signal input ZWEF.

Figure 2:
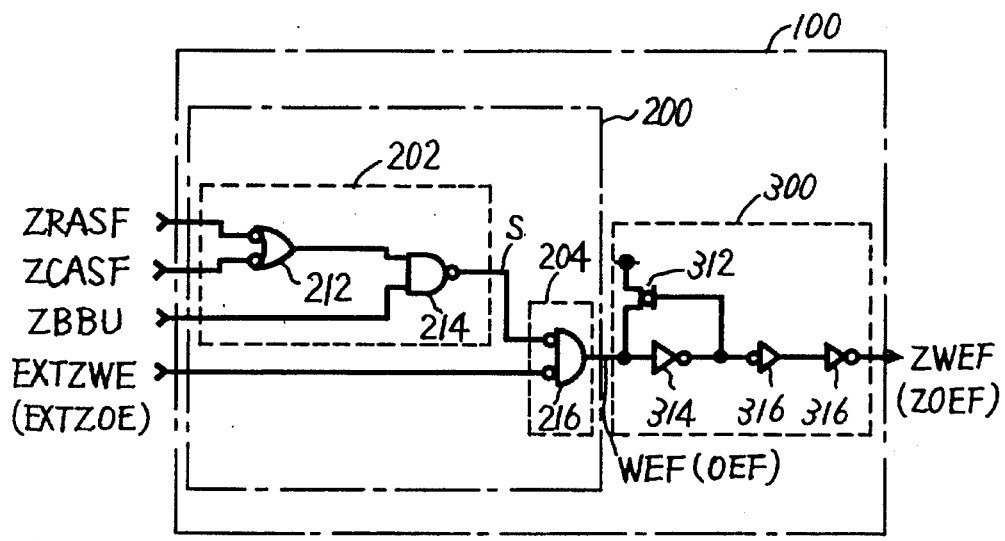
FIG. 2 is a detailed circuit diagram showing a structure of an external input/output control signal input buffer circuit according to the present invention.

FIG. 2 is a circuit diagram showing in detail an example of a structure of the external input/output control signal input buffer circuit shown in FIG. 1.

Signals ZRASF and ZCASF are applied to an NAND circuit 212. An NAND circuit 214 receives an output of NAND circuit 212 and signal ZBBU. Output signal S of NAND circuit 214 and external input/output control signal EXTZWE are applied to an NOR circuit 216. NOR circuit 216 provides internal signal WEF. The relationship of the level of various signals is shown in FIG. 4.

Since signals ZRASF, ZCASF and ZBBU all attain an H level in a stand-by state, operation state detection signal S is pulled up to an H level. Therefore, signal WEF is pulled down to an L level regardless of the level signal EXTZWE.

Also in a self refresh state, signals ZCASF and ZBBU both attain an L level, so that operation state detection signal S is pulled up to an H level regardless of the level of signal ZRASF. Therefore, internal signal WEF attains an L level regardless of the level of signal EXTZWE.

Since operation state detection signal S attains an L level in a read/write state, internal signal WEF is an inverted version of signal EXTZWE.

Thus, a signal corresponding to external input/output control signal EXTZWE, i.e. internal signal WEF passes through the latch circuit and the driver circuit to be output as internal input/output control signal ZWEF only in a read/write state.

External input/output control signal input buffer circuit 100 is rendered inactive when in a stand-by state and a self refresh state.

NOR circuit 216 is closed in a stand-by state and a self refresh state. Therefore, generation of a through current is suppressed independent of the level of external input/output control signal EXTZWE.

Furthermore, since the output of NOR circuit 216 is temporarily held in a latch circuit and then output as an internal input/output control signal via a driver circuit, the influence of a transition of an external input/output control signal on an internal input/output control signal can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device that can specify three operations modes of a stand-by state, a self refresh state, and a read/write state by an external signal, comprising:

timing signal generation means responsive to said external signal for providing an internal signal specifying one of said three operation modes, control signal input buffer means receiving said internal signal and an external input/output control signal for providing an internal input/output control signal, wherein said control signal input buffer means comprises
      a first CMOS logic gate circuit controlled by said internal signal and receiving said external input/output control signal, for providing a corresponding said internal input/output control signal when in said read/write operation state, and attaining a closed state when in said stand-by state and said self refresh state, and data input/output buffer means responsive to said internal input/output control signal for inputting/outputting data.

2. A dynamic semiconductor device that can specify three operation modes of a stand-by state, a self refresh state, and a read/write operation state by a combination of signal levels of a first external signal and a second external signal, said dynamic semiconductor memory device comprising:

timing signal generation means responsive to said first and second external signals for providing a corresponding first internal signal and a corresponding second internal signal and a self refresh mode signal, control signal input buffer means receiving said first internal signal, said second internal signal, said self refresh mode signal, and an external input/output control signal for providing an internal input/output control signal, wherein said control signal input buffer means comprises
      a first logic gate circuit for receiving said first internal signal, said second internal signal, and said self refresh mode signal for providing an operation state detection signal, and
      a second CMOS logic gate circuit controlled by said operation state detection signal and receiving said external input/output control signal, for providing a corresponding said internal input/output control signal when in said read/write operation state, and attaining a closed state when in said stand-by state and said refresh state, and data input/output buffer means responsive to said internal input/output control signal for inputting/outputting data.

3. The semiconductor memory device according to claim 2, wherein said control signal input buffer means comprises
   a latch circuit receiving an output signal of said second CMOS logic gate circuit for carrying out a maintaining operation of said output signal level, and
   a drive circuit receiving an output of said latch circuit for providing said internal input/output control signal.

4. The dynamic semiconductor memory device according to claim 2, wherein said first external signal includes a row strobe signal, and said second external signal includes a column strobe signal,
   wherein said first logic circuit comprises
      a first NAND circuit for receiving said first and second internal signals, and
      a second NAND circuit for receiving an output of said first NAND circuit and said self refresh mode signal, and
   wherein said second CMOS logic gate circuit comprises
      a CMOS NOR circuit for receiving an output of said second NAND circuit and said external input/output control signal.

5. The dynamic semiconductor memory device according to claim 3, wherein said first external signal includes a row strobe signal and said second external signal includes a column strobe signal,
   wherein said first logic circuit comprises
      a first NAND circuit for receiving said first and second internal signals, and
      a second NAND circuit for receiving an output of said first NAND circuit and said self refresh mode signal,
   wherein said second CMOS logic gate circuit comprises
      a CMOS NOR circuit for receiving an output of said second NAND circuit and said external input/output control signal.

* * * * *